US010446434B2

(12) United States Patent
Korngut et al.

(10) Patent No.: US 10,446,434 B2
(45) Date of Patent: Oct. 15, 2019

(54) CHUCK FOR SUPPORTING A WAFER

(71) Applicant: APPLIED MATERIALS ISRAEL LTD., Rehovot (IL)

(72) Inventors: Doron Korngut, Modiin (IL); Yuri Belenky, Rishon Lezion (IL); Yoram Uziel, Misgav (IL); Ron Naftali, Shoham (IL); Ron Bar-or, Ramat-Gan (IL); Yuval Gronau, Ramat Hasharon (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 68 days.

(21) Appl. No.: 15/134,306

(22) Filed: Apr. 20, 2016

(65) Prior Publication Data

US 2017/0309511 A1    Oct. 26, 2017

(51) Int. Cl.
| | |
|---|---|
| *B25B 1/00* | (2006.01) |
| *H01L 21/687* | (2006.01) |
| *H01L 21/67* | (2006.01) |
| *B25B 11/02* | (2006.01) |
| *B32B 38/18* | (2006.01) |
| *B25B 1/24* | (2006.01) |
| *B23B 31/08* | (2006.01) |
| *B32B 37/00* | (2006.01) |

(52) U.S. Cl.
CPC .. *H01L 21/68785* (2013.01); *H01L 21/67288* (2013.01); *H01L 21/68735* (2013.01); *H01L 21/68742* (2013.01); *H01L 21/68764* (2013.01); *B23B 31/08* (2013.01); *B25B 1/2484* (2013.01); *B25B 11/02* (2013.01); *B32B 37/0046* (2013.01); *B32B 38/1833* (2013.01); *H01L 21/67092* (2013.01)

(58) Field of Classification Search
CPC ......... H01L 21/68785; H01L 21/68764; H01L 21/68742; H01L 21/6838; H01L 21/67092; B25B 1/2484; B25B 11/02; B23B 31/00; B23B 31/02; B23B 31/08; B23B 32/12; B23B 38/1833; B23B 38/1841; B23B 37/0046
USPC ..... 269/289 R, 266, 296, 21, 22; 250/491.1; 356/399; 279/128
See application file for complete search history.

(56) References Cited

U.S. PATENT DOCUMENTS

| | | | | |
|---|---|---|---|---|
| 4,525,852 A | * | 6/1985 | Rosenberg | ............... B23Q 1/36 250/491.1 |
| 5,760,564 A | * | 6/1998 | Novak | ..................... B23Q 3/00 269/55 |

(Continued)

*Primary Examiner* — Monica S Carter
*Assistant Examiner* — Katina N. Henson
(74) *Attorney, Agent, or Firm* — Kilpatrick Townsend & Stockton LLP (57) ABSTRACT

According to an embodiment, a support module is provided for supporting a substrate. The support module may include a chuck and a vertical stage. The chuck may include multiple chuck segments that are independently movable. When the substrate is positioned on the chuck, different chuck segments are positioned under different areas of the substrate. The vertical stage may include multiple piezoelectric motors. Each piezoelectric motor may be configured to perform nanometric scale elevation and lowering movements. The multiple piezoelectric motors may be configured to independently move the multiple chuck segments.

18 Claims, 10 Drawing Sheets

(56) References Cited

U.S. PATENT DOCUMENTS

| | | | | |
|---|---|---|---|---|
| 5,914,568 A | * | 6/1999 | Nonaka | H01L 21/6831 315/111.21 |
| 7,078,655 B1 | * | 7/2006 | Ito | C04B 35/00 219/444.1 |
| 8,966,763 B1 | * | 3/2015 | Heck | B25B 1/2415 219/656 |
| 9,372,396 B2 | * | 6/2016 | Kruijt-Stegeman | B82Y 10/00 |
| 2009/0153824 A1 | * | 6/2009 | Balan | G03B 27/42 355/67 |

* cited by examiner

CHUCK FOR SUPPORTING A WAFER

BACKGROUND

A system may use an image sensor for acquiring images of areas of a substrate. The images may be acquired during one or more processes such as but not limited to a manufacturing process, an inspection process, and the like.

The acquisition of an image may require positioning an image sensor at an exact distance from the substrate.

During the positioning process the entire substrate may be elevated or lowered in relation to the image sensor. The elevation or lowering of the entire substrate reduces the accuracy of the positioning process, increases the duration of the positioning process and may require applying substantial forces in the substrate.

Furthermore, in wafer inspection and review (also in production) it is extremely important to arrive at a position with very high accuracy in the order of 1 nm and remain still in that position during the image grab with ~0.1 nm accuracy.

Any pitch or tilt error of the stage may result in a navigation error or vibrations during the image acquisition.

The reason for this is that the interferometer measures the distance to the stage at a plane that may be several mm below the wafer plane.

X and Y errors results that is equal to this lever H times the angular error in pitch or tilt.

For example, for a 10 mm lever and a 1 microradian tilt error, an X error would result that is equal to 10 nm.

There is a growing need to provide an effective positioning process.

SUMMARY

According to an embodiment of the invention there may be provided a support module for supporting a substrate. The support module may include a chuck and a vertical stage. The chuck may include multiple chuck segments that are independently movable. When the substrate is positioned on the chuck, different chuck segments are positioned under different areas of the substrate. The vertical stage may include multiple piezoelectric motors. Each piezoelectric motor may be configured to perform nanometric scale elevation and lowering movements. The multiple piezoelectric motors may be configured to independently move the multiple chuck segments.

The different piezoelectric motors may be configured to move different chuck segments.

The chuck may include an upper layer that may be configured to interface with a bottom surface of the substrate. The upper layer may be integrated with the multiple chuck segments.

The chuck may include an upper layer that may be configured to interface with a bottom surface of the substrate. The upper layer may be connected to the multiple chuck segments.

The multiple chuck segments have a length and width of a Centimetric scale.

At least a majority of the multiple chuck segments may have the same dimensions.

At least two chuck segments of the multiple chuck segments may differ from each other by shape.

The support module may include a controller for controlling the multiple piezoelectric motors.

The vertical stage may also include multiple additional piezoelectric motors and a load. The multiple additional piezoelectric motors may be mechanically coupled to the load and to the multiple piezoelectric motors. The multiple additional piezoelectric motors may be configured to counter movements of the multiple piezoelectric motors.

The load may include multiple load segments that may be independently movable by the multiple additional piezoelectric motors.

The multiple load segments may be of different size and weight as the multiple chuck segments.

The multiple additional piezoelectric motors and the multiple piezoelectric motors may be mechanically coupled to a frame.

The frame may be mechanically coupled to an X-Y stage.

The support module may include a controller for controlling the multiple piezoelectric motors and the multiple additional piezoelectric motors.

The support module may include a controller for controlling the multiple piezoelectric motors thereby compensating for a tilt error of an area of the substrate.

BRIEF DESCRIPTION OF THE DRAWINGS

The subject matter regarded as the invention is particularly pointed out and distinctly claimed in the concluding portion of the specification. The invention, however, both as to organization and method of step, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

Figure 1:
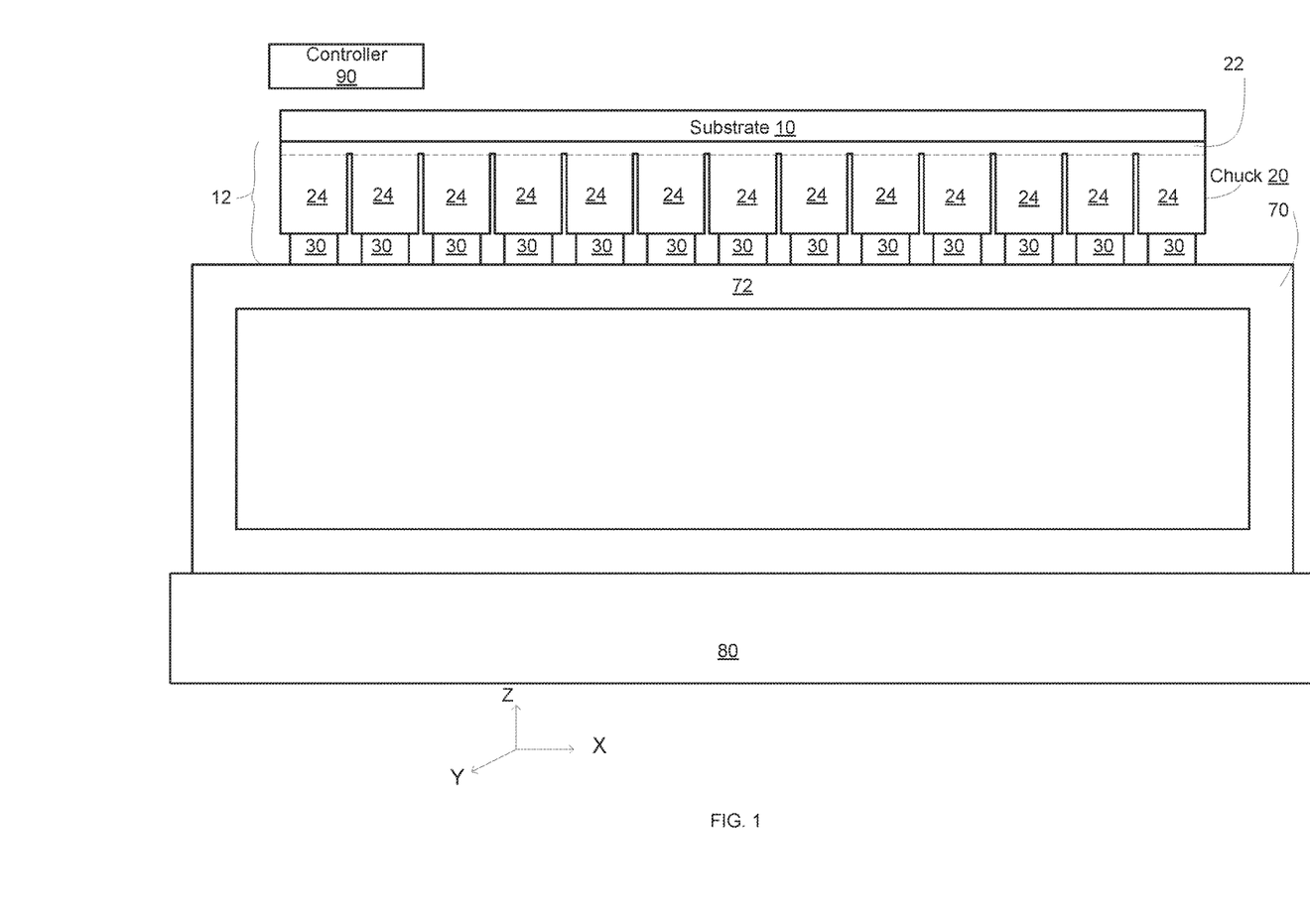
FIG. 1 is a cross sectional view of a substrate, a support module for supporting a substrate, a frame, an additional stage and a controller according to an embodiment of the invention.

FIG. 1 is a cross sectional view of substrate 10, support module 12 for supporting substrate 10, frame 70, additional stage 80 and controller 90 according to an embodiment of the invention.

Support module 12 includes chuck 20 and vertical stage 31.

Chuck 20 includes multiple chuck segments 24 that are independently movable. Accordingly—one chuck segment 24 may be vertically moved while another chuck segment may not be moved.

Substrate 10 is positioned on the chuck 20. Different chuck segments are positioned under different areas of the substrate.

Vertical stage 31 includes multiple piezoelectric motors 30. Each piezoelectric motor is configured to perform nanometric scale elevation and lowering movements.

Controller 90 is configured to control the movements of the multiple piezoelectric motors 30. The controller 90 may control the movements according to a predefined recipe, in response to height measurements of the substrate (or selected areas of the substrate), and the like.

The multiple piezoelectric motors 30 are configured to independently move the multiple chuck segments. For example—each chuck segment 24 may be moved (vertically) by a single piezoelectric motor.

Selected portions of the substrate 10 may be elevated or lowered by nanometric scale movements (for example—between 1 and 50 nanometers) during an inspection process of the substrate 10, during a manufacturing process of the substrate 10 or during any other process that is related to the substrate 10.

Only one or more selected areas of the substrate 10 can be moved by the vertical stage 31.

Each elected area may be a fraction (for example—between 0.01 percent and 10 percent of the entire substrate) of the substrate. Moving only a fraction of the substrate (instead of the entire substrate) may dramatically reduce the force required for vertical movements and may increase the accuracy of the vertical movements while reducing the time required for vertical movements.

Because the movements are of nanometric scale, the substrate 10 may locally bend or otherwise deform. The movements of the substrate 10 may be aligned according to mechanical modes of the substrate. The mechanical modes of the substrate may be simulated, measured or otherwise estimated before moving the substrate or while the substrate is moved.

Chuck 20 includes upper layer 22 that is configured to interface with a bottom surface of substrate 10. In FIG. 1 the upper layer 22 is integrated with the multiple chuck segments 24. Alternatively—the upper layer 22 may be connected to the multiple chuck segments.

According to an embodiment of the invention the multiple chuck segments have a length and/or width of a Centimetric scale. For example—the chuck segments may have a diameter and/or width of between 0.5 and 4 centimeter. It is noted that the chuck segments may have a width and/or length of a millimetric scale and/or have a width and/or length of micron scale. Non-limiting examples of ranges of the width and/or length of chuck segments may include 1 micron-5 centimeter or any sub range within the range of 1 micron-5 centimeter.

The chuck segments of a chuck may have the same shape and/or size. Alternatively—at least some chuck segments may differ from other chuck segments by at least one of shape and/or size.

Non-limiting examples of shapes of chuck segments include a polygon shape, a circular shape, an elliptical shape, stripes, and the like.

There may be a space between adjacent chuck segments (as illustrated in FIG. 1) to allow X-axis movements and/or Y-axis movements between adjacent chuck segments.

Alternatively—there may be no gap between adjacent chuck segments.

In FIG. 1 the vertical stage 31 is supported by a base 72 of frame 70 that in turn is supported by additional stage 80. The additional stage 80 may be an X-axis stage, a Y-axis stage, an X-Y stage, a rotational stage, another vertical stage, and the like. It should be noted that the additional stage 80 is optional and/or that the vertical stage 31 may be supported by mechanical elements that differ from frame 70.

Figure 2:
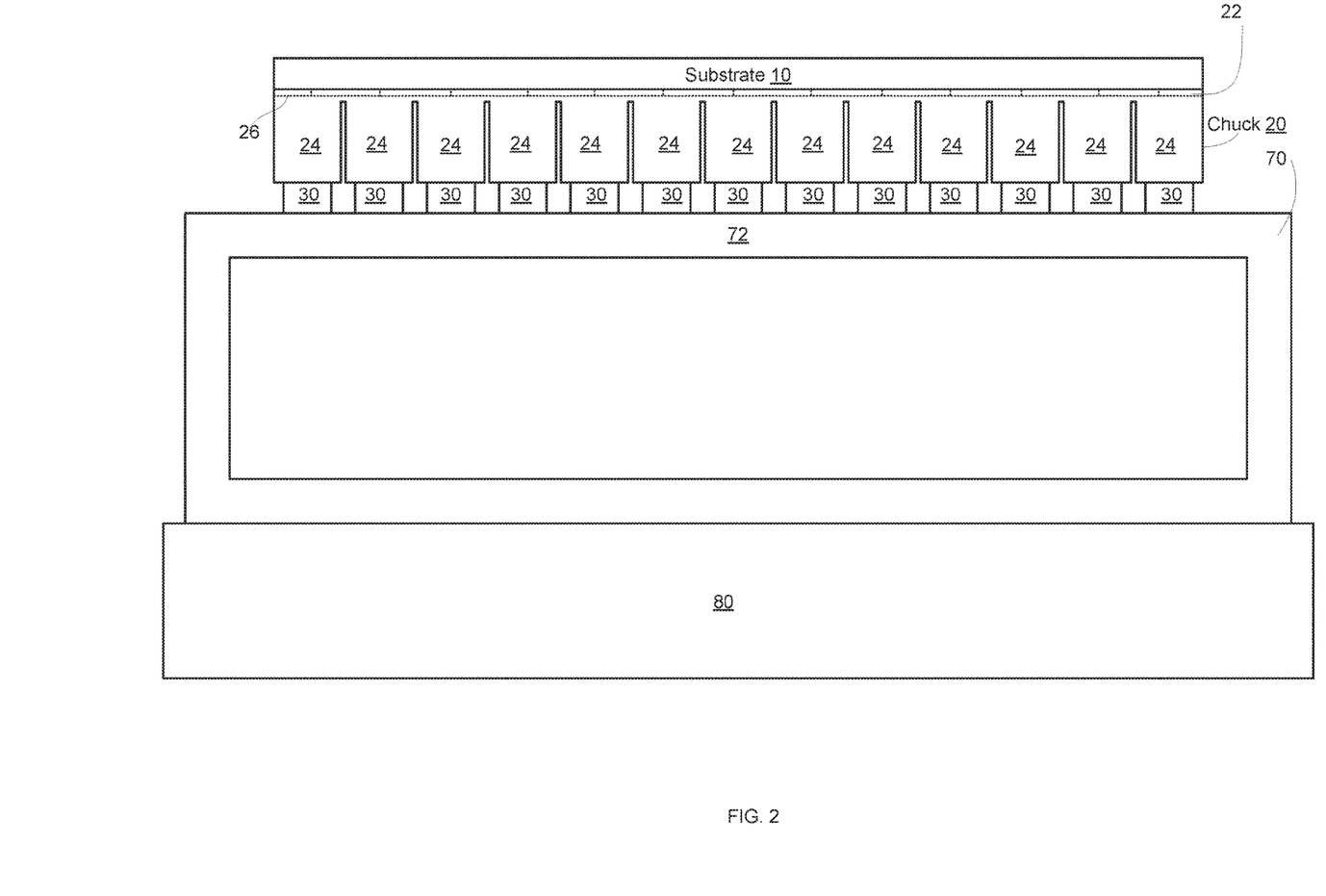
FIG. 2 is a cross sectional view of a substrate, a support module for supporting a substrate, a frame, an additional stage and a controller according to an embodiment of the invention.

FIG. 2 is a cross sectional view of substrate 10, support module 12 for supporting substrate 10, frame 70, additional stage 80 and controller 90 according to an embodiment of the invention.

FIG. 2 differs from FIG. 1 by illustrating vacuum channels 26 of the chuck 20.

Figure 3:
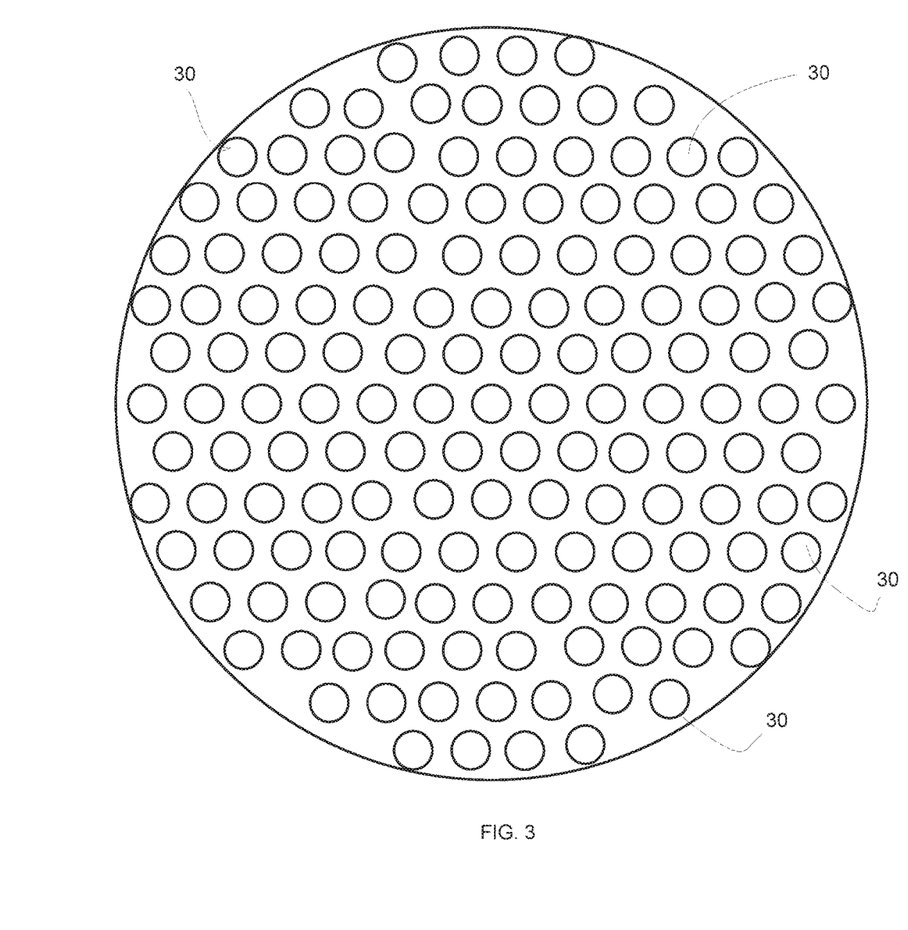
FIG. 3 is a bottom view of a chuck that includes multiple chuck segments according to an embodiment of the invention.

FIG. 3 is a bottom view of chuck that includes multiple chuck segments 24 according to an embodiment of the invention. In FIG. 3 the chuck segments 24 have a circular shape. Adjacent chuck segments are spaced apart from each other.

Figure 4:
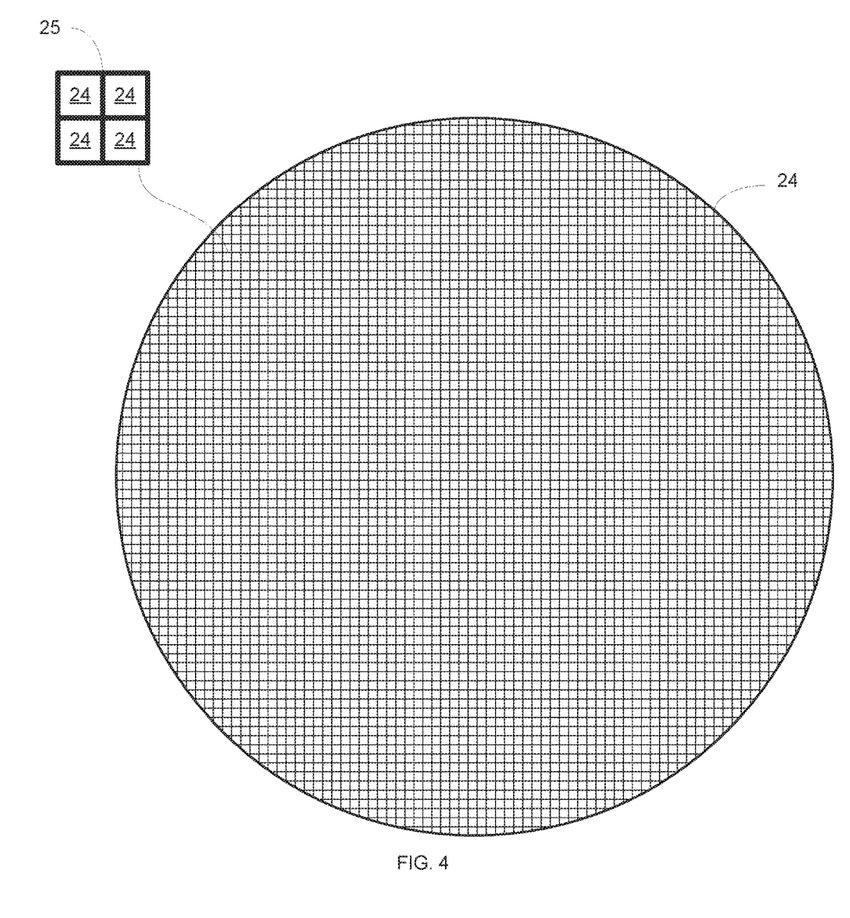
FIG. 4 is a bottom view of a chuck that includes multiple chuck segments according to an embodiment of the invention.

FIG. 4 is a bottom view of chuck that includes multiple chuck segments 24 according to an embodiment of the invention. In FIG. 4 the chuck segments 24 have a rectangular shape.

There are spacing 25 between adjacent chuck segments—although the chuck segments 24 of FIG. 4 are closer to each other in relation to the chuck segments 24 of FIG. 3.

Figure 5:
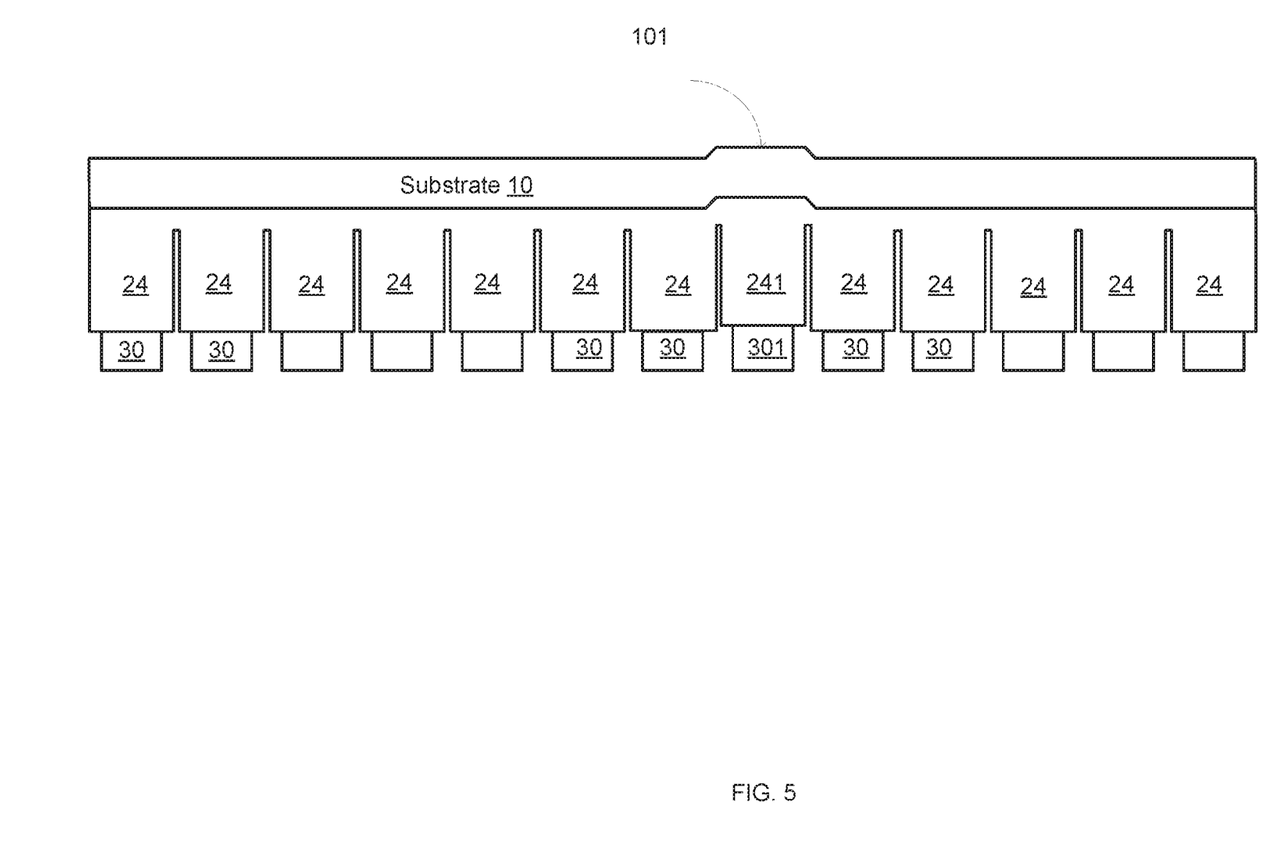
FIG. 5 is a cross sectional view of a substrate and a support module according to an embodiment of the invention.

FIG. 5 is a cross sectional view of substrate 10 and support module according to an embodiment of the invention.

In FIG. 5 a given piezoelectric motor 301 elevates a given chuck segments 241 in relation to other chuck segments 24 and a selected area 101 of substrate 10 is slightly elevated in relation to other areas of the substrate 10.

It is noted that any combination of any number of piezoelectric motors may introduce any movements to any chuck segments.

According to an embodiment of the invention any (or at least some) movements of the multiple piezoelectric motors may be countered in order to reduce and even eliminate the introduction of forces on frame 70.

Figure 6:
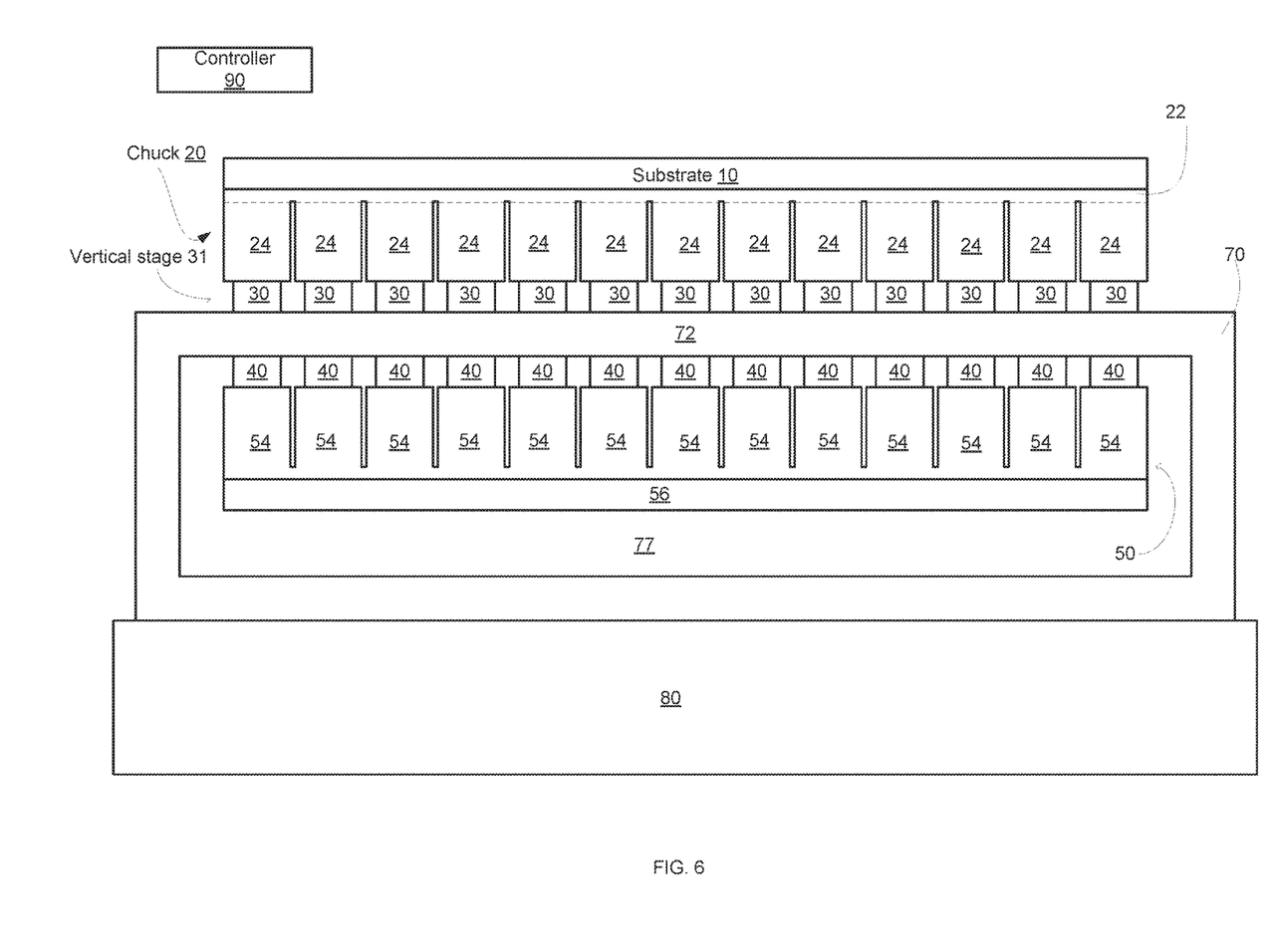
FIG. 6 is a cross sectional view of a substrate, a support module for supporting a substrate, a frame, an additional stage, a controller, multiple additional piezoelectric motors and a load according to an embodiment of the invention.

FIG. 6 is a cross sectional view of substrate 10, support module 12 for supporting substrate 10, frame 70, additional stage 80, controller 90, multiple additional piezoelectric motors and load 50 according to an embodiment of the invention.

Load 50 includes multiple load segments 54 and a lower portion 56. The multiple additional piezoelectric motors 40 the load 50 are positioned below base 72 of frame 70 and are located within an interior space 77 defined by frame 70.

The controller 90 is configured to control the movements of the multiple additional piezoelectric motors 40 in order to counter movements of the multiple piezoelectric motors 30.

Load 50 may have substantially the same shape and weight as a combination of the chuck 20 and the substrate 10.

Any movement of one or more piezoelectric motor 30 may be countered or substantially countered by a corresponding movement of one or more additional piezoelectric motor 40. The movements of the one or more additional piezoelectric motors are designed to apply on base 72 one or more counter forces that are of the same magnitude but opposite direction to one or more forces that are applied by the one or more piezoelectric motor 30 on base 72.

Figure 7:
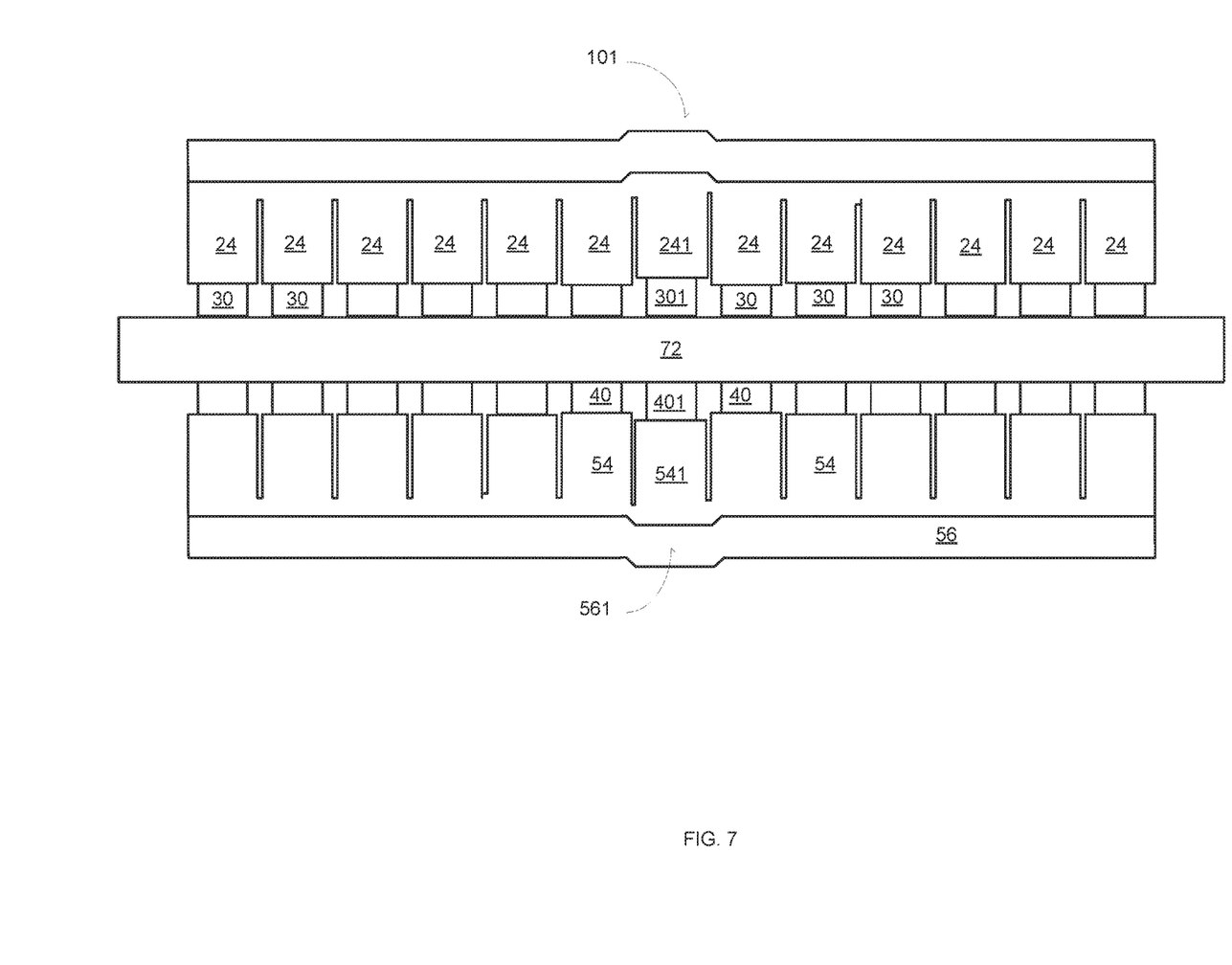
FIG. 7 is a cross sectional view of a substrate and a support module according to an embodiment of the invention.

FIG. 7 is a cross sectional view of substrate 10, and support module according to an embodiment of the invention.

In FIG. 7 a given piezoelectric motor 301 elevates a given chuck segments 241 in relation to other chuck segments 24 and a selected area 101 of substrate 10 is slightly elevated in relation to other areas of the substrate 10.

In addition, a given additional piezoelectric motor 401 elevates a perform a counter movement by lowering a given load segment 541 in relation to other load segments 54 and a selected area 561 of a lower portion 56 of load is slightly lowered in relation to other areas of the lower portion 56.

Figure 8:
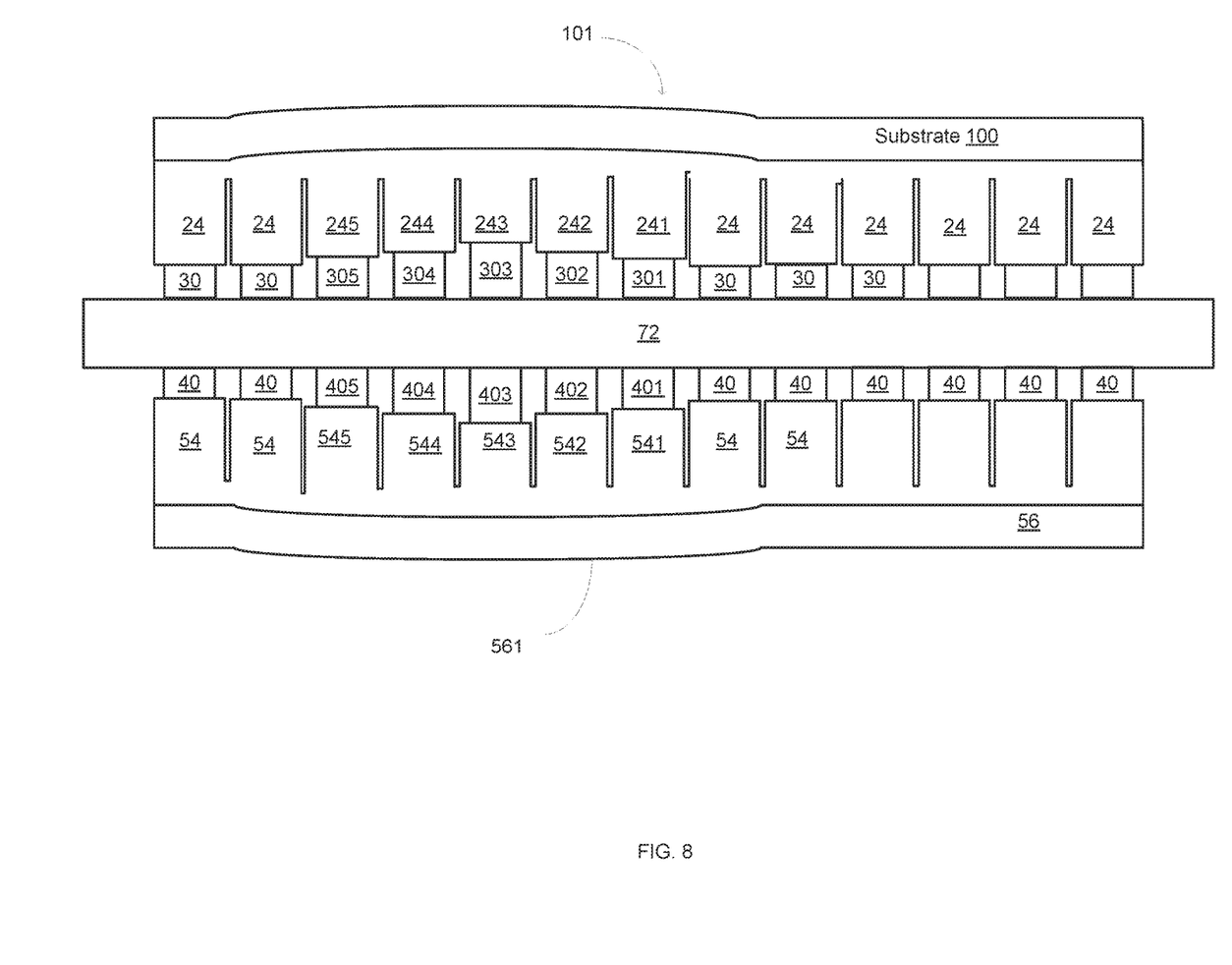
FIG. 8 is a cross sectional view of a substrate and a support module according to an embodiment of the invention.

FIG. 8 is a cross sectional view of substrate 10, and support module according to an embodiment of the invention.

In FIG. 8 few given piezoelectric motors 301, 302, 303, 304 and 305 elevate few given chuck segments 241, 242, 243, 244 and 245 in relation to other chuck segments 24 and a selected area 101 of substrate 10 is slightly elevated in relation to other areas of the substrate 10.

In addition, few given additional piezoelectric motors 401, 402, 403, 404 and 405 elevate a perform counter movements by lowering few given load segments 541, 542, 543, 544 and 545 in relation to other load segments 54 and a selected area 561 of a lower portion 56 of load is slightly lowered in relation to other areas of the lower portion 56.

Figure 9:
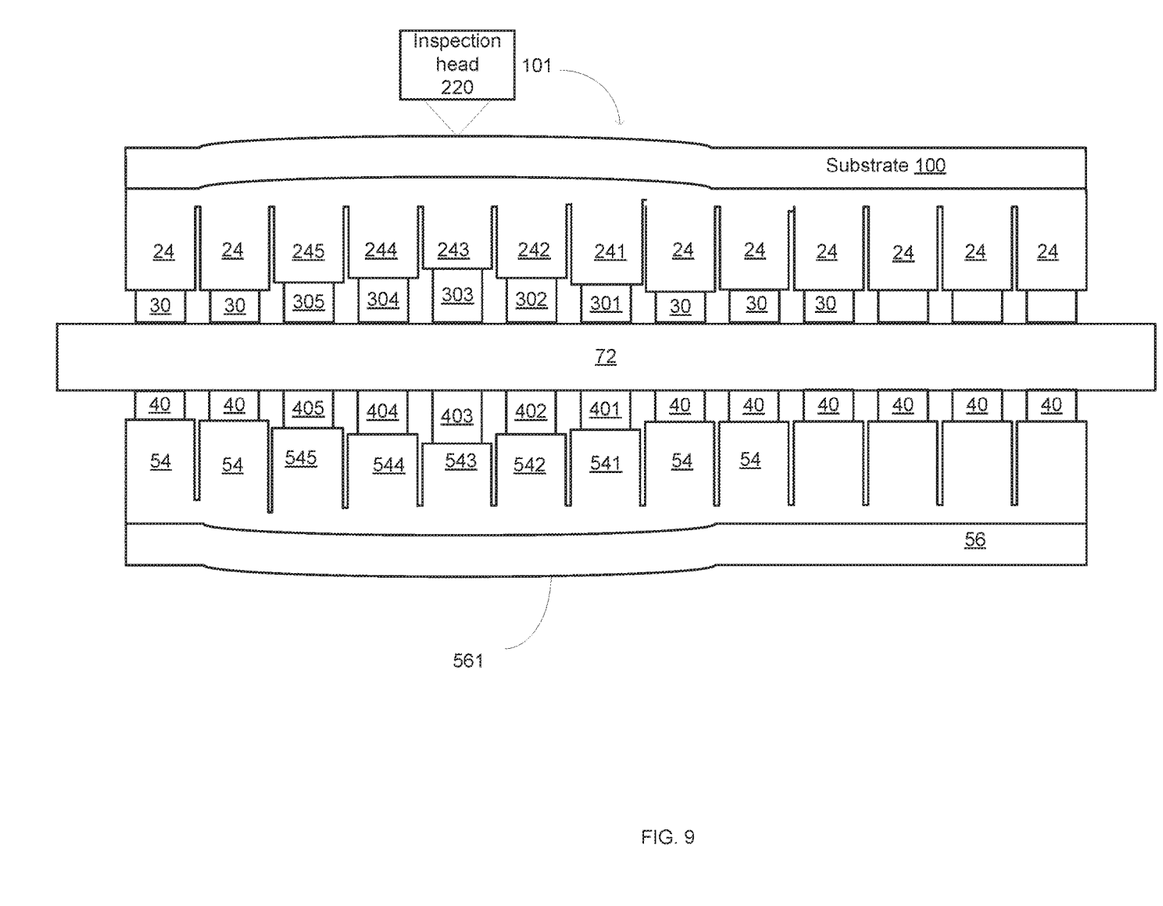
FIG. 9 is a cross sectional view of a substrate and a support module according to an embodiment of the invention.

FIG. 9 is a cross sectional view of substrate 10, and support module according to an embodiment of the invention.

FIG. 9 differs from FIG. 8 by further illustrating an inspection head 220 that inspects the elevated area 101 of substrate 100. The inspection head 220 may, at different points in time, view other areas of the substrate and these other areas may be positioned, when inspected, at desired distances from the inspection head 220 by elevating and/or lowering one or more chuck segments.

In FIGS. 9 the upper surface of the substrate 100 may be convex—but may have has a substantially flat top/central area that can be inspected by inspection head 220.

Furthermore—the elevated area may be tilted by one or more piezoelectric motors in order to compensate for tilt errors of the elevated area or any other area of the substrate. The tilt of the elevated area may be measured by the inspection head 220 or by another tilt measurement device. A non-limiting example of tile measurement may include measuring the heights of three different points of the elevated area that are not located along a single line.

The tile of the elevated area may be compared to a desired orientation (for example—a pure horizontal position) to calculate the tilt error. The tilt error calculation may be performed by controller 90 or by another unit.

When the elevated area is directly above a piezoelectric motor then the tilt error can be compensated by moving one or more other piezo electric motors—for example one, two or three neighboring piezo electric motors.

Figure 10:
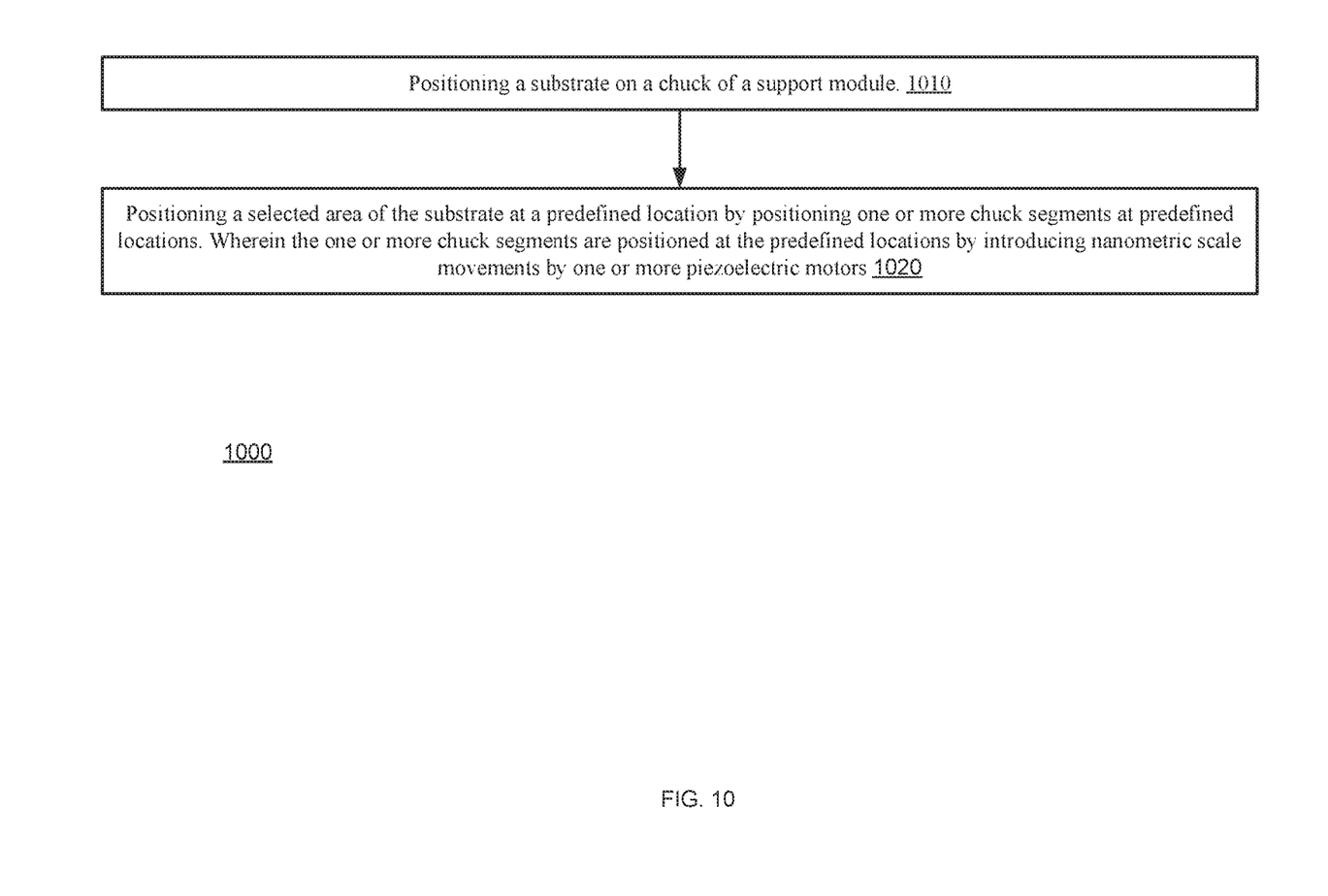
FIG. 10 illustrates a method according to an embodiment of the invention.

FIG. 10 illustrates method 1000 according to an embodiment of the invention.

Method 1000 may include the following sequence of steps:

Step 1010 of positioning a substrate on a chuck of a support module.

Step 1020 of positioning a selected area of the substrate at a predefined location by positioning one or more chuck segments at predefined locations. Wherein the one or more chuck segments are positioned at the predefined locations by introducing nanometric scale movements by one or more piezoelectric motors.

Wherein the one or more chuck segments belong to multiple chuck segments that are independently movable. Wherein different chuck segments are positioned under different areas of the substrate.

Wherein the one or more piezoelectric motors belong to multiple piezoelectric motors. Wherein each piezoelectric motor is configured to perform nanometric scale elevation and lowering movements. Wherein the multiple piezoelectric motors are configured to independently move the multiple chuck segments.

Step 1020 may be followed by step 1030 of selecting a new selected area and jumping to step 1020.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of step in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described steps are merely illustrative. The multiple may be combined into a single step, a single step may be distributed in additional steps and steps may be executed at least partially overlapping in time. Moreover, alternative embodiments may include multiple instances of a particular step, and the order of steps may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A support module for supporting a substrate, wherein the support module comprises a chuck and a vertical stage;
    wherein the chuck comprises multiple chuck segments that are independently movable under different areas of the substrate and with respect to the substrate; wherein when the substrate is positioned on the chuck, different chuck segments are positioned under different areas of the substrate, each chuck segment configured to elevate a corresponding area of the substrate in relation to other areas of the substrate;
    wherein the vertical stage comprises multiple first piezoelectric motors; wherein each first piezoelectric motor is configured to perform nanometric scale elevation and lowering movements; and wherein each first piezoelectric motor is independently mechanically coupled to a corresponding chuck segment of the multiple chuck segments and is configured to independently move the corresponding chuck segment; and
    wherein the vertical stage further comprises a frame mechanically coupled to the multiple first piezoelectric motors;
    wherein the vertical stage further comprises multiple second piezoelectric motors and a load having multiple load segments; wherein the frame is further mechanically coupled to the multiple second piezoelectric motors; and wherein each second piezoelectric motor is independently mechanically coupled to a corresponding load segment of the multiple load segments and is positioned between the corresponding load segment and a corresponding first piezoelectric motor of the multiple first piezoelectric motors and also between the corresponding load segment and the frame.

2. The support module according to claim 1 wherein the chuck further comprises a plurality of vacuum channels.

3. The support module according to claim 1 wherein the chuck comprises an upper layer that is configured to interface with a bottom surface of the substrate; and wherein the upper layer is integrated with each of the multiple chuck segments.

4. The support module according to claim 1 wherein adjacent chuck segments of the multiple chuck segments are spaced apart from each other.

5. The support module according to claim 1 wherein the multiple chuck segments have a length and width of a Centimetric scale.

6. The support module according to claim 1 wherein at least a majority of the multiple chuck segments have same dimensions.

7. The support module according to claim 1 wherein at least two chuck segments of the multiple chuck segments differ from each other by shape.

8. The support module according to claim 1 further comprising a controller for controlling the multiple first piezoelectric motors.

9. The support module according to claim 1 wherein the multiple second piezoelectric motors are configured to counter movements of the multiple first piezoelectric motors.

10. The support module according to claim 1 wherein each load segment is independently movable by a corresponding second piezoelectric motor of the multiple second piezoelectric motors.

11. The support module according to claim 1 wherein the multiple load segments have sizes and weights that are different from sizes and weights of the multiple chuck segments.

12. The support module according to claim 1 wherein the frame is mechanically coupled to an X-Y stage.

13. The support module according to claim 1 further comprising a controller for controlling the multiple first piezoelectric motors and the multiple second piezoelectric motors.

14. The support module according to claim 1 comprising a controller configured for controlling the multiple first piezoelectric motors to compensate for a tilt error of an area of the substrate by adjusting at least one first piezoelectric motor neighboring a particular piezoelectric motor corresponding to the area of the substrate.

15. The support module according to claim 1 wherein at least part of the frame is positioned between the multiple first piezoelectric motors and the multiple second piezoelectric motors; and wherein the multiple second piezoelectric motors are configured to apply countering forces to the frame to reduce forces applied to the frame by the multiple first piezoelectric motors.

16. The support module according to claim 1 wherein the multiple second piezoelectric motors and the load are positioned within an interior space defined by the frame.

17. The support module according to claim 1 wherein the load has substantially a same shape and weight as a combination of the chuck and the substrate.

18. The support module according to claim 1 wherein each of the different areas of the substrate correspond to 0.01% to 10% of the substrate.

* * * * *